United States Patent
Su et al.

(10) Patent No.: US 10,980,113 B2
(45) Date of Patent: Apr. 13, 2021

(54) CIRCUIT BOARD STRUCTURE INCORPORATED WITH RESIN-BASED CONDUCTIVE ADHESIVE LAYER

(71) Applicant: ADVANCED FLEXIBLE CIRCUITS CO., LTD., Zhongli (TW)

(72) Inventors: Kuo-Fu Su, Zhongli (TW); Chih-Heng Chuo, Bade (TW); Gwun-Jin Lin, Taoyuan (TW)

(73) Assignee: Advanced Flexible Circuits Co., Ltd., Zhongli (TW)

( * ) Notice: Subject to any disclaimer, the term of this patent is extended or adjusted under 35 U.S.C. 154(b) by 0 days.

(21) Appl. No.: 16/412,613

(22) Filed: May 15, 2019

(65) Prior Publication Data

US 2020/0170109 A1    May 28, 2020

(30) Foreign Application Priority Data

Nov. 22, 2018  (TW) ................................. 107141565

(51) Int. Cl.
*H05K 1/11*   (2006.01)
*H05K 1/14*   (2006.01)
*H05K 3/46*   (2006.01)

(52) U.S. Cl.
CPC .......... *H05K 1/115* (2013.01); *H05K 3/4635* (2013.01); *H05K 1/14* (2013.01); *H05K 2201/0195* (2013.01); *H05K 2201/0212* (2013.01); *H05K 2201/095* (2013.01)

(58) Field of Classification Search
CPC ................. H05K 1/115; H05K 3/4635; H05K 2201/0195; H05K 2201/0212; H05K 2201/095
See application file for complete search history.

(56) References Cited

U.S. PATENT DOCUMENTS

| | | | |
|---|---|---|---|
| 5,727,310 A * | 3/1998 | Casson | H05K 3/323 29/830 |
| 9,942,984 B1* | 4/2018 | Su | H05K 1/0245 |
| 2010/0140556 A1* | 6/2010 | Kojima | H05K 3/323 252/500 |
| 2012/0228009 A1* | 9/2012 | Muro | H05K 1/0218 174/254 |
| 2018/0273809 A1* | 9/2018 | Lin | C09J 7/385 |

OTHER PUBLICATIONS

First page of Publication CN 108633165A, published Oct. 9, 2018.*

* cited by examiner

*Primary Examiner* — Ishwarbhai B Patel
(74) *Attorney, Agent, or Firm* — Rosenberg, Klein & Lee

(57) ABSTRACT

A circuit board structure that includes a resin-based conductive adhesive layer is disclosed, in which a conductive layer is arranged between a first circuit board and a second circuit board. The conductive layer includes a first conductive paste layer and the resin-based conductive adhesive layer is formed on the first conductive paste layer. The resin-based conductive adhesive layer contains a sticky resin material and a plurality of conductive particles distributed in the sticky resin material. The plurality of conductive particles establish an electrical connection between the first conductive paste layer and the resin-based conductive adhesive layer.

10 Claims, 5 Drawing Sheets

CIRCUIT BOARD STRUCTURE INCORPORATED WITH RESIN-BASED CONDUCTIVE ADHESIVE LAYER

BACKGROUND OF THE INVENTION

1. Field of the Invention

The present invention relates to a circuit board structure, and in particular to a flexible circuit board that includes a conductive paste layer incorporated with a resin-based conductive adhesive layer.

2. The Related Arts

To meet the needs for being thin in device thickness, compact in size, and light in weight, various electronic devices that are currently available in the market use flexible circuit boards that carry various electronic parts and conductive wiring mounted thereon. The flexible circuit boards are often structured to include at least one conductive layer. Heretofore, such a conductive layer is made of a primary ingredient material of copper or silver. However, a flexible circuit board that includes a conductive layer having a structure that is formed of copper or silver suffers certain shortcomings, such as being of an enlarged thickness and being not sufficiently flexible, and this would cause certain constraints to the applications thereof. Further, the conductive layer of a flexible circuit board that is made of copper or silver does not possess availability for setting or selecting a specific direction in which conducting may be made.

Further, in view of the trend that the amount of data that is necessarily transmitted through common conductive wiring is getting constantly increased, the number of lines of signal transmission wiring must be increased accordingly, and also, the frequencies that the data are transmitted with are increased as well. Improper lay-out of the conductive layer might cause, in actual applications, reflection of signals, radiations of electromagnetic wave, loss of transmitted signals, and distortion of signal waveforms, and so on.

SUMMARY OF THE INVENTION

In view of the drawbacks of the prior art, an objective of the present invention is to provide a circuit board structure that includes a conductive paste layer incorporated with a resin-based conductive adhesive layer, particularly for use in a flexible circuit board.

The technical solution that the present invention adopts to achieve the above objective comprises a first circuit board and a second circuit board between which a conductive layer is arranged. The conductive layer comprises a first conductive paste layer and a resin-based conductive adhesive layer laminated on the first conductive paste layer. The resin-based conductive adhesive layer contains a sticky resin material and a plurality of conductive particles distributed in the sticky resin material. The plurality of conductive particles establishes electrical connection between the first conductive paste layer and the resin-based conductive adhesive layer.

The technical solution of the present invention further comprises: a first conductive via, which extends through the first surface and the second surface of the first substrate, the first conductive via being in electrical connection with at least one first signal line of the first conductive line layer, the first conductive paste layer being formed with a first non-coating zone in a circumferential area around the first conductive via; and a second conductive via, which extends through the first surface and the second surface of the second substrate, the second conductive via being in electrical connection with at least one second signal line of the second conductive line layer, the second conductive paste layer being formed with a second non-coating zone in a circumferential area around the second conductive via.

In the technical solution of the present invention, a first conductive zone is formed between the first conductive via and the first non-coating zone.

In the technical solution of the present invention, the resin-based conductive adhesive layer comprises an anisotropic conductive film.

The technical solution of the present invention may further comprises: a first grounding via, which extends through the first surface and the second surface of the first substrate, the first grounding via being in electrical connection with the at least one first grounding line of the first conductive line layer and the first conductive paste layer; and a second grounding via, which extends through the first surface and the second surface of the first substrate, the second grounding via being in electrical connection with the at least one second grounding line of the second conductive line layer and the second conductive paste layer.

The technical solution of the present invention may further comprise a second conductive paste layer, which is formed between the second substrate and the resin-based conductive adhesive layer.

In the technical solution of the present invention, the first surface of the first substrate is further formed with a first insulation layer, and the first surface of the second substrate is further formed with a second insulation layer.

The present invention is applicable to a flexible circuit board in the form of a single-sided board, a double-sided board, or a multiple-layered board.

The efficacy of the present invention is that a conductive paste layer and a resin-based conductive adhesive layer are combined to form a conductive layer of a flexible circuit board to serve as a grounding layer or a conductive line layer. Compared to a known conductive layer structure of a flexible circuit board that is made of copper or silver, the present invention offers advantages of reduced thickness and enhanced flexibility. And, if necessary, a conductive via can be formed to provide electrical connection between signal lines of different conductive line layers, and connection between a grounding line and the conductive paste layer can be achieved with a grounding via.

A more detailed description of embodiments of the present invention will be provided below, with reference to certain examples and the drawings that illustrate the present invention.

DETAILED DESCRIPTION OF THE PREFERRED EMBODIMENTS

Figure 1:
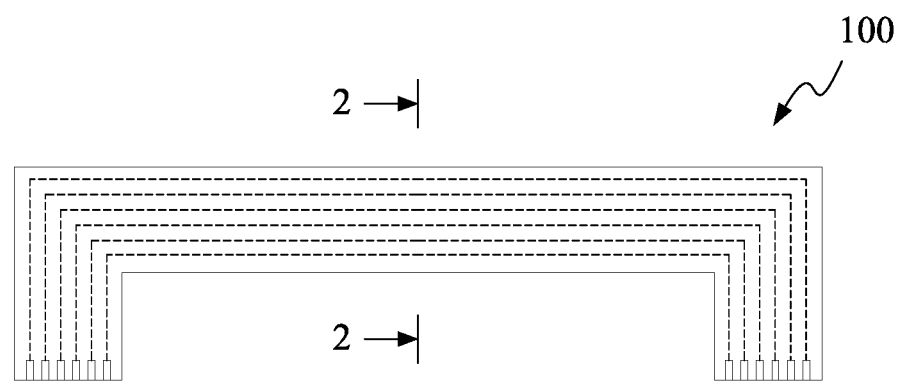
FIG. 1 is a plan view showing a flexible circuit board according to a first embodiment of the present invention.
Figure 2:
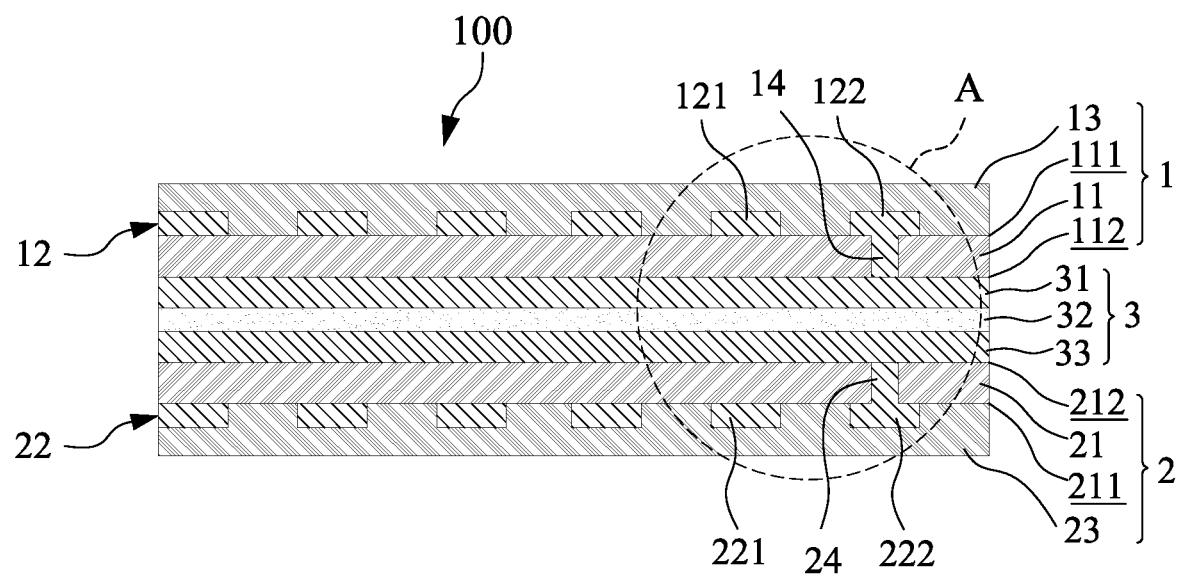
FIG. 2 is a cross-sectional view taken along line 2-2 of FIG. 1.

Referring to FIGS. 1 and 2, FIG. 1 is a plan view showing a flexible circuit board according to a first embodiment of the present invention and FIG. 2 is a cross-sectional view taken along line 2-2 of FIG. 1. As shown in the drawings, in the first embodiment of the present invention, the flexible circuit board 100 comprises a first circuit board 1, a second circuit board 2, and a conductive layer 3 that is laminated between and thus combined with the first circuit board 1 and the second circuit board 2.

The first circuit board 1 comprises a first substrate 11. The first substrate 11 has a first surface 111 and a second surface 112, and a first conductive line layer 12 is formed on the first surface 111. A first insulation layer 13 may be formed on the first surface 111 of the first substrate 11.

The second circuit board 2 comprises a second substrate 21. The second substrate 21 has a first surface 211 and a second surface 212, and a second conductive line layer 22 is formed on the first surface 211. A second insulation layer 23 may be formed on the first surface 211 of the second substrate 21.

Figure 3:
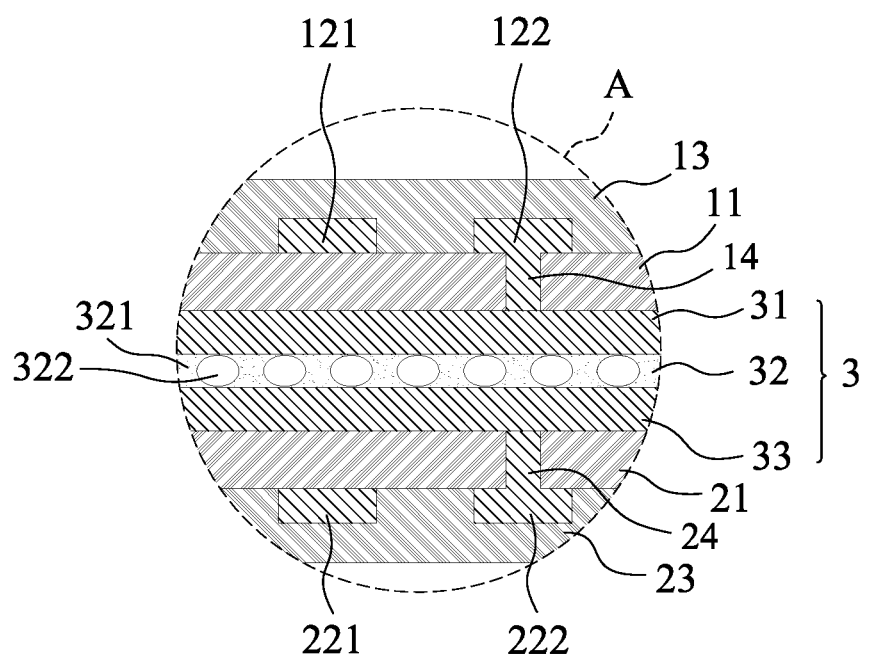
FIG. 3 is an enlarged view of a circled portion "A" of FIG. 2.

Referring to FIG. 3, an enlarged view of a circled portion "A" of FIG. 2 is shown. The conductive layer 3 comprises a first conductive paste layer 31, a resin-based conductive adhesive layer 32, and a second conductive paste layer 33. The first conductive paste layer 31 is formed on the second surface 112 of the first substrate 11, and the second conductive paste layer 33 is formed on the second surface 212 of the second substrate 21. The resin-based conductive adhesive layer 32 is laminated between the first conductive paste layer 31 and the second conductive paste layer 33.

The resin-based conductive adhesive layer 32 contains a sticky resin material 321 and a plurality of conductive particles 322 mixed and distributed in the sticky resin material 321. For example, the resin-based conductive adhesive layer 32 can be made of an anisotropic conductive film, and the anisotropic conductive film is laminated between the first conductive paste layer 31 and the second conductive paste layer 33 under a predetermined pressure at a predetermined temperature.

The first conductive paste layer 31 and the second conductive paste layer 33 are each made of electrically conducting paste, which can be one of silver paste, copper paste, and aluminum paste.

The first conductive line layer 12 can be formed thereon with various forms of conductive wiring as desired, such as one that includes at least one first signal line 121 and at least one grounding line 122, wherein the first signal line 121 comprises a pair of or multiple high-frequency differential-mode conductive lines that are arranged adjacent to each other and insulatively isolated from each other for transmitting high-frequency signals in digital or analog forms, or may alternatively comprises common-mode conductive lines for transmitting common-mode signals, or, further alternatively, may comprise at least one high-frequency conductive line (such as an antenna signal).

The first substrate 11 may comprise at least one first grounding via 14 in electrical connection with the first conductive paste layer 31 and the first grounding line 122 of the first conductive line layer 12. Similarly, the second substrate 21 may comprise at least one second grounding via 24 in electrical connection with the second conductive paste layer 33 and a second grounding line 222 of the second conductive line layer 22.

In the first embodiment shown in FIG. 3, the conductive particles 322 contained in the resin-based conductive adhesive layer 32 are each in electrical contact with surfaces of the first conductive paste layer 31 and the second conductive paste layer 33 that are opposite to each other, so that the first conductive paste layer 31 and the second conductive paste layer 33 are electrically connected with each other through the conductive particles 322 of the resin-based conductive adhesive layer 32. The conductive particles 322 contained in the resin-based conductive adhesive layer 32 can be of a single shape, which can be a circular shape or an elliptic shape.

Figure 4:
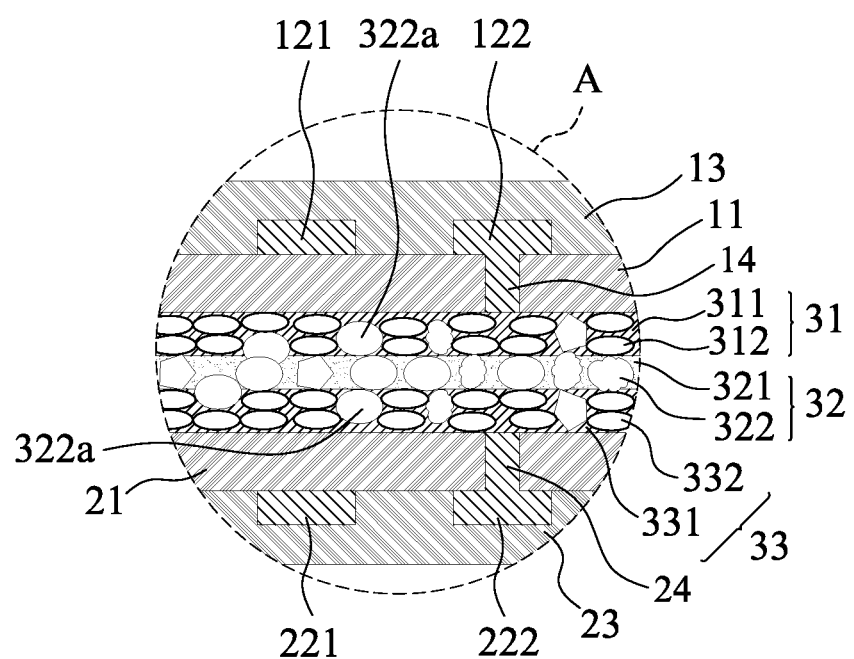
FIG. 4 illustrates an example in which conductive particles are made with different shapes and/or different sizes.

FIG. 4 provides an example that illustrates the conductive particles 322 contained in the resin-based conductive adhesive layer 32 can be of different shapes and/or different particle sizes or diameters, and the first conductive paste layer 31 comprises an adhesive agent 311 and multiple pieces of conductive filler 312 distributed in the adhesive agent 311. The second conductive paste layer 33 also comprises an adhesive agent 331 and multiple pieces of conductive filler 332 distributed in the adhesive agent 331.

Some of the conductive particles, such as those designated at 322a, contained in the resin-based conductive adhesive layer 32 are received and partly inlaid in gaps between the multiple pieces of the conductive fillers 312, 322 of the first conductive paste layer 31 and the second conductive paste layer 33 and are in electrical contact with the pieces of the conductive fillers 312, 332 adjacent thereto. As such, the first conductive paste layer 31 and the second conductive paste layer 33 are made in electrical connection with each other through the conductive particles 322 contained in the resin-based conductive adhesive layer 32 and the inlaid conductive particles 322a.

Figure 5:
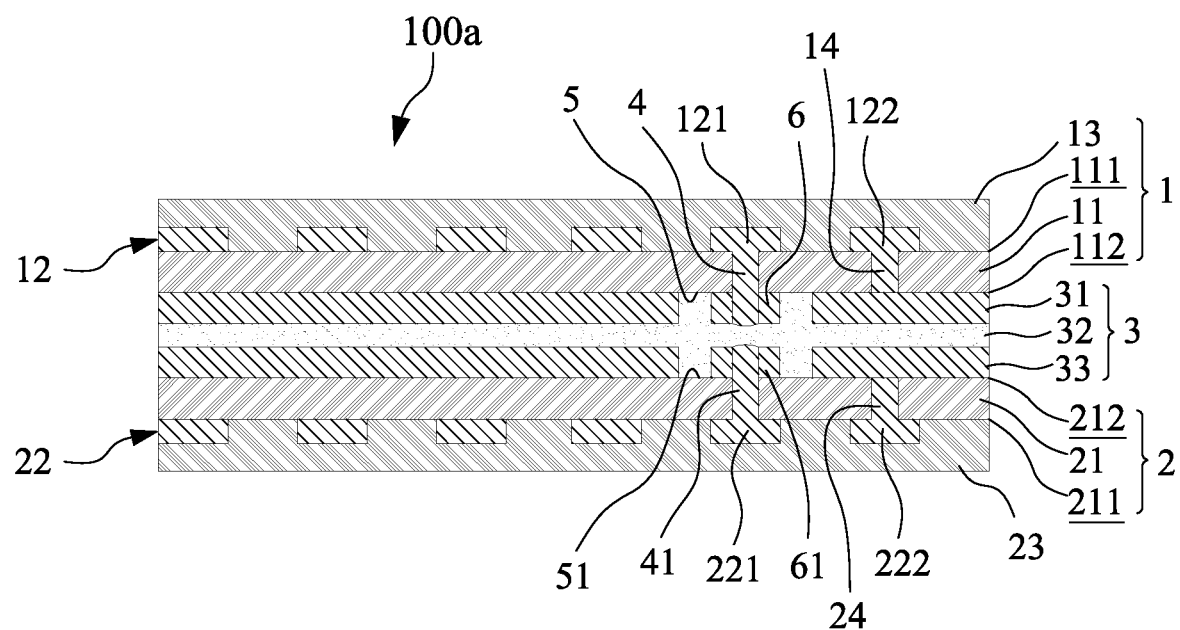
FIG. 5 is a cross-sectional view showing a second embodiment of the present invention.
Figure 6:
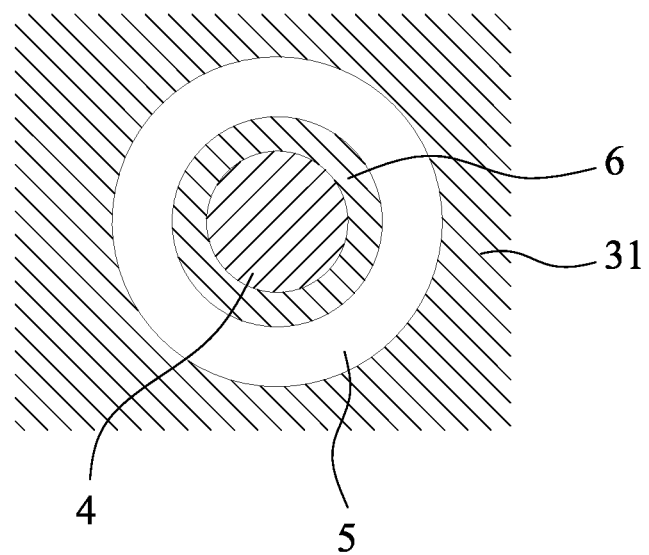
FIG. 6 is a plan view illustrating a spatial relationship among a first conductive via, a first conductive paste layer, and a first non-coating zone of FIG. 5.

FIG. 5 is a cross-sectional view showing a second embodiment of the present invention, and FIG. 6 is a plan view illustrating a spatial relationship among a first conductive via, a first conductive paste layer, and a first non-coating zone of FIG. 5. The instant embodiment is made up of components and parts that are generally identical or similar to those of the first embodiment shown in FIG. 2, and identical or similar parts are labeled with the same reference numeral for consistency and correspondence therebetween.

The instant embodiment further comprises a first conductive via 4, which extends through the first substrate 11. The first conductive via 4 is electrically connected to the first signal line 121 of the first conductive line layer 12. Further, the first conductive paste layer 31 is formed with a first non-coating zone 5 (see FIG. 6) located on a circumferential area around the first conductive via 4. Preferably, a first conductive zone 6 is formed, for example by means of coating or other known techniques, between the first conductive via 4 and the first non-coating zone 5 (by using a material the same as that making the first conductive paste layer 31) to be electrically connected with the first conductive via 4 to expand an electric connect area.

Similarly, a second conductive via 41 is formed to extend through the second substrate 21, and the second conductive via 41 is electrically connected to the second signal line 221 of the second conductive line layer 22. Further, the second conductive paste layer 33 is formed with a second non-coating zone 51 located on a circumferential area around the second conductive via 41. Preferably, a second conductive zone 61 is formed, for example by means of coating or other known techniques, between the second conductive via 41 and the second non-coating zone 51 to be electrically connected with the second conductive via 41 to expand an electric connect area.

Based on the above structural arrangement, the first signal line 121 of the first conductive line layer 12 and the second signal line 221 of the second conductive line layer 22 are set in electric connection with the resin-based conductive adhesive layer 32 by way of the first conductive via 4 and the second conductive via 41, respectively. Further, the first grounding line 122 of the first conductive line layer 12 and the second grounding line 222 of the second conductive line layer 22 are respectively set in electric connection with the first conductive paste layer 32 and the second conductive paste layer 33 by way of the first grounding via 14 and the second grounding via 24, respectively.

Figure 7:
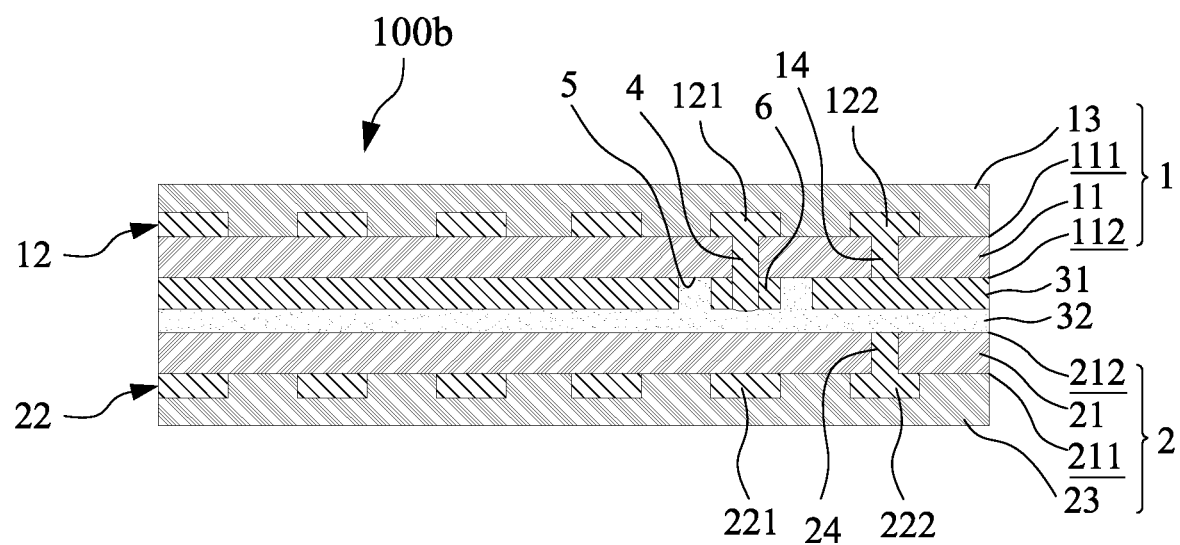
FIG. 7 is a cross-sectional view showing a third embodiment of the present invention.

FIG. 7 is a cross-sectional view showing a third embodiment of the present invention. In the instant embodiment, the flexible circuit board 100b is made up of components/parts that are generally identical or similar to those that make the first embodiment of FIG. 2, and a difference between the two embodiments is that, in the instant embodiment, the conductive layer 3 comprises a first conductive paste layer 31 and a resin-based conductive adhesive layer 32 only. The first conductive paste layer 31 is formed on the second surface 112 of the first substrate 11, and the resin-based conductive adhesive layer 32 is laminated between the first conductive paste layer 31 and the second surface 212 of the second substrate 21.

The embodiments that were discussed above are provided as examples for use as double-sided circuit boards; however, the present invention is also applicable to for example single-side boards and multiple-layered circuit boards.

Figure 8:
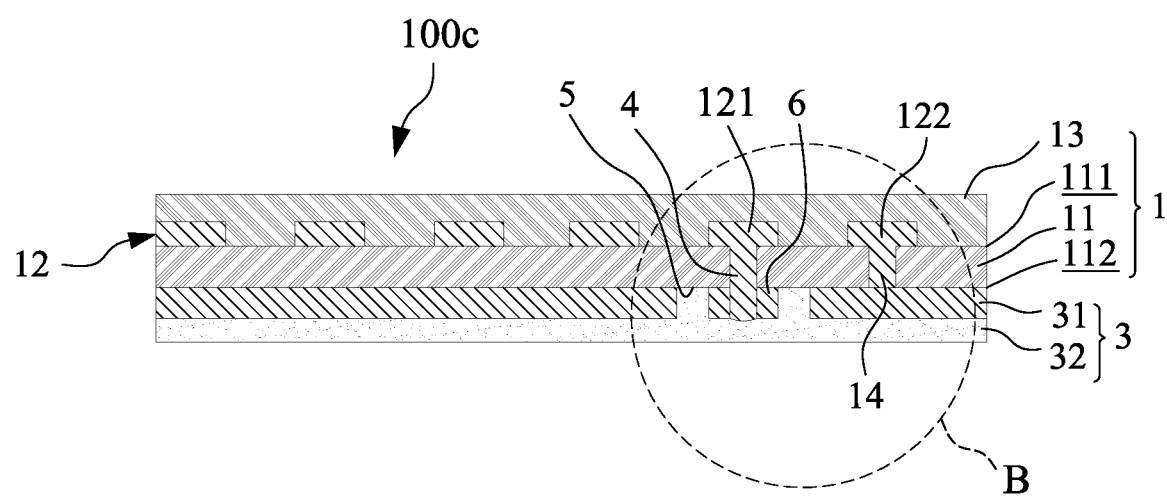
FIG. 8 is a cross-sectional view showing a fourth embodiment of the present invention.

Referring to FIG. 8, a cross-sectional view showing a third embodiment of the present invention is provided. In the instant embodiment, the flexible circuit board 100c comprises a first circuit board 1 and a conductive layer 3. A first conductive line layer 12 is formed on a first surface 111 of a first substrate 11 of the first circuit board 1. A first insulation layer 13 is formed on the first surface 111 of the first substrate 11.

The conductive layer 3 comprises a first conductive paste layer 31 and a resin-based conductive adhesive layer 32. The first conductive paste layer 31 is formed on the second surface 112 of the first substrate 11, and the resin-based conductive adhesive layer 32 is laminated on an undersurface of the first conductive paste layer 31.

The first substrate 11 may comprise at least one first grounding via 14 formed therein to electrically connect with the first conductive paste layer 31 and a first grounding line 122 of the first conductive line layer 12.

The first substrate 11 may also comprise at least one first conductive via 4 formed therein to extend through the first surface 111 and the second surface 112 of the first substrate 11, such that a top end of the first conductive via 4 is in electrical connection with a first signal line 121 of the first conductive line layer 12 and a bottom end is in electrical connection with the resin-based conductive adhesive layer 32. Further, the first conductive paste layer 31 is formed with a first non-coating zone 5 in a circumferential area of a bottom surface thereof that surrounds the first conductive via 4 so as to have the first conductive via 4 and the first conductive paste layer 31 insulatively isolated from each other.

Figure 9:
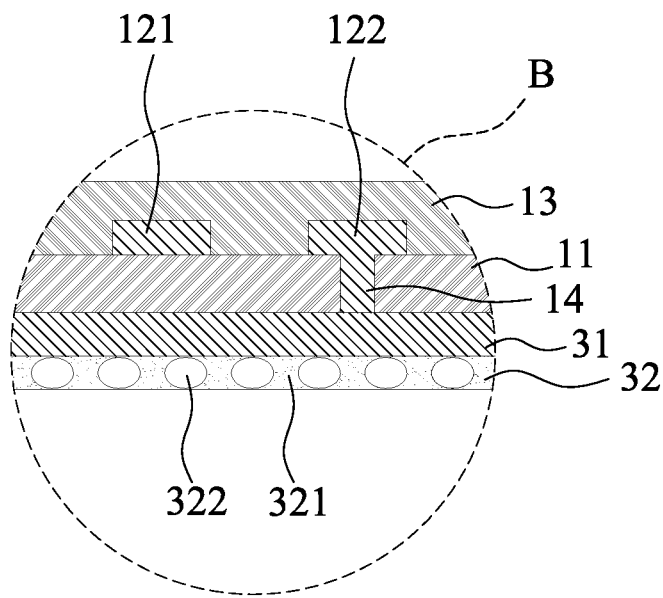
FIG. 9 is an enlarged view of a circled portion "B" of FIG. 8.

FIG. 9 is an enlarged view of a circled portion "B" of FIG. 8, showing the resin-based conductive adhesive layer 32 contains a sticky resin material 321 and a plurality of conductive particles 322 mixed and distributed in the sticky resin material 321. For example, the resin-based conductive adhesive layer 32 can be made of an anisotropic conductive film, and the anisotropic conductive film is laminated on the bottom surface of the first conductive paste layer 31 under a predetermined pressure at a predetermined temperature.

Figure 10:
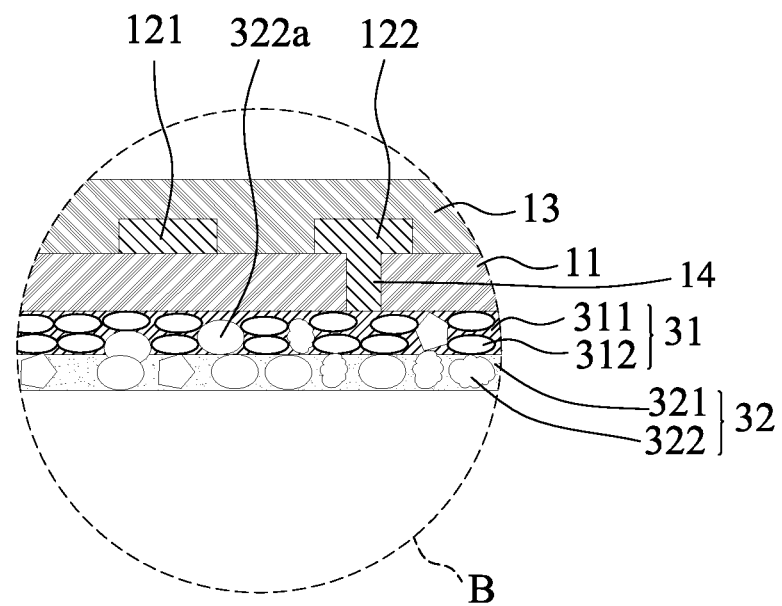
FIG. 10 illustrates an example in which conductive particles of FIG. 9 are made with different shapes and/or different sizes.

FIG. 10 illustrates an example in which conductive particles 322 contained in the resin-based conductive adhesive layer 32 can be of different shapes and/or different particle sizes or diameters. The first conductive paste layer 31 comprises an adhesive agent 311 and multiple pieces of conductive filler 312 distributed in the adhesive agent 311. Some of the conductive particles, such as those designated at 322a, contained in the resin-based conductive adhesive layer 32 are received and partly inlaid in gaps between the multiple pieces of the conductive fillers 312 of the first conductive paste layer 31 and the second conductive paste layer 33 and are in electrical contact with the pieces of the conductive fillers 312, 332 adjacent thereto.

The above description provides embodiments for illustrating, as examples, the structural arrangement of the present invention, but is not intended to impose undue limitations to the present invention. Those skilled in the art may readily make modifications and variations of the embodiments described above, without departing from the structural arrangement and spirit of the present invention, which are defined in the appended claims, and the scope of protection that this application seeks for should be construed based on the appended claims.

What is claimed is:

1. A circuit board structure, comprising:
   a first circuit board, which includes:
      a first substrate having a first surface and a second surface opposite the first surface, at least one first grounding via extending through the first surface and the second surface of the first substrate, and
      a first conductive line layer formed on the first surface of the first substrate, the first conductive line layer including at least one first grounding line;
   a second circuit board, which includes:
      a second substrate having a first surface and a second surface opposite the first surface, and
      a second conductive line layer formed on the first surface of the second substrate; and
   a conductive layer formed between the first circuit board and the second circuit board;
   wherein the conductive layer includes:
      a first conductive paste layer formed on the second surface of the first substrate, the first conductive paste layer being electrically connected with the first grounding line of the first conductive line layer through the first grounding via, and
      a resin-based conductive adhesive layer laminated between the first conductive paste layer and the second substrate, the resin-based conductive adhesive layer containing a sticky resin material and a plurality of conductive particles distributed in the sticky resin material, the plurality of conductive particles establishing an electrical conduction between the first conductive paste layer and the resin-based conductive adhesive layer.

2. The circuit board structure according to claim 1, wherein the resin-based conductive adhesive layer comprises an anisotropic conductive film.

3. The circuit board structure according to claim 1, further comprising:
   a second conductive paste layer formed on the second surface of the second substrate and the resin-based conductive adhesive layer; and
   a second conductive via extending through the first surface and the second surface of the second substrate, the second conductive via being in electrical connection with at least one second signal line of the second conductive line layer, the second conductive paste layer being formed with an insulating second non-coating zone in a circumferential area around the second conductive via.

4. The circuit board structure according to claim 1, wherein the first surface of the first substrate is further formed with a first insulation layer, and the first surface of the second substrate is further formed with a second insulation layer.

5. A circuit board structure, comprising:
   a first substrate having a first surface and a second surface opposite the first surface, at least one first grounding via extending through the first surface and the second surface of the first substrate;
   a first conductive line layer formed on the first surface of the first substrate, the first conductive line layer including at least one first grounding line; and
   a conductive layer formed on the second surface of the first substrate, functioning as a grounding layer, the conductive layer including:
      a first conductive paste layer formed on the second surface of the first substrate, the first conductive paste layer being electrically connected with the first grounding line of the first conductive line layer through the first grounding via, and
      a resin-based conductive adhesive layer formed on a bottom surface of the first conductive paste layer, the resin-based conductive adhesive layer containing a sticky resin material and a plurality of conductive particles distributed in the sticky resin material.

6. The circuit board structure according to claim 5, wherein the resin-based conductive adhesive layer comprises an anisotropic conductive film.

7. The circuit board structure according to claim 5, wherein the first surface of the first substrate is further formed with a first insulation layer.

8. A circuit board structure, comprising:
   a first substrate having a first surface and a second surface opposite the first surface;
   at least one first grounding via extending through the first surface and the second surface of the first substrate
   a first conductive line layer formed on the first surface of the first substrate, the first conductive line layer including at least one first grounding line; and
   a conductive layer formed on the second surface of the first substrate, the conductive layer including:
      a first conductive paste layer formed on the second surface of the first substrate, the first conductive paste layer being electrically connected with the first grounding line of the first conductive line layer through the first grounding via and
      a resin-based conductive adhesive layer formed on a bottom surface of the first conductive paste layer, the resin-based conductive adhesive layer being separated from the first substrate by the first conductive paste layer, the resin-based conductive adhesive layer containing a sticky resin material and a plurality of conductive particles distributed in the sticky resin material.

9. The circuit board structure according to claim 8, wherein the resin-based conductive adhesive layer comprises an anisotropic conductive film.

10. The circuit board structure according to claim 8, wherein the first surface of the first substrate is further formed with a first insulation layer.

* * * * *